(12) United States Patent
Nesimoglu et al.

(10) Patent No.: US 7,518,441 B2
(45) Date of Patent: Apr. 14, 2009

(54) SIGNAL PROCESSOR FOR USE WITH A POWER AMPLIFIER IN A WIRELESS CIRCUIT

(75) Inventors: Tayfun Nesimoglu, Bristol (GB); Kevin A Morris, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 11/534,860

(22) Filed: Sep. 25, 2006

(65) Prior Publication Data
US 2007/0123184 A1 May 31, 2007

(30) Foreign Application Priority Data
Nov. 30, 2005 (GB) ................... 0524426.4

(51) Int. Cl.
*H03F 3/38* (2006.01)
(52) U.S. Cl. .......................... 330/10; 330/136
(58) Field of Classification Search .................. 330/10, 330/136
See application file for complete search history.

(56) References Cited

U.S. PATENT DOCUMENTS 6,794,931 B2 * 9/2004 Kenington ................... 330/10

FOREIGN PATENT DOCUMENTS

GB 2 359 681 8/2001

* cited by examiner

*Primary Examiner*—Steven J Mottola
(74) *Attorney, Agent, or Firm*—Oblon, Spivak, McClelland, Maier & Neustadt, P.C.

(57) ABSTRACT

A signal processor has an input terminal and an output terminal for use in a wireless transmitter, for generating a radio frequency signal suitable for transmission, either with or without further power amplification. The signal processor separates an input signal into first and second processing paths, the first processing path generating a pulse train signal which is a digitised envelope signal, and the second processing path comprising phase processing means operable to generate a constant envelope phase signal. An RF switch is operable to switch the phase signal by means of the pulse train signal.

16 Claims, 10 Drawing Sheets

US 7,518,441 B2

SIGNAL PROCESSOR FOR USE WITH A POWER AMPLIFIER IN A WIRELESS CIRCUIT

FIELD OF THE INVENTION

The present invention generally relates to a signal processor for use with a power amplifier in a wireless circuit.

BACKGROUND OF THE INVENTION

A signal in a transmitter undergoes a number of stages, such as modulation, up conversion and amplification, before actually being transmitted. A transmitter in a wireless circuit usually comprises a variety of circuit elements such as frequency mixer, local oscillator, power amplifiers, filters and antennas.

With reference to FIG. 1, a block circuit diagram of a conventional transmitter 10 is shown. The conventional transmitter 10 in FIG. 1 includes a baseband source 12, an up-converter (comprising a local oscillator 14 and a mixer 16), a power amplifier chain 18 and an antenna 20. In the transmitter circuit 10, the baseband source 12 produces an intermediate frequency (IF) signal. The IF signal is provided to the up-converter, which converts the IF signal to a radio frequency (RF) signal. The RF signal is provided to the power amplifier chain 18 which amplifies the signal and finally the signal is transmitted through the antenna 20. The power amplifier chain 18 generally includes preamplifiers and power amplifiers.

As wireless communications system evolves, the demand for a light weight wireless terminal with longer battery life also increases. Power amplifiers typically dominate the power consumption of these terminals. Hence, there is also an increased demand for low distortion and highly efficient RF power amplifiers to be implemented in the transmit chain of a wireless terminal.

In order to increase power efficiency, amplifiers need to be driven close to their saturation region, where they have a tendency to non-linearity and there may be significant levels of distortion. Distortion can be reduced by backing off the amplifier from saturation, but this reduces the power efficiency. There is an inherent trade-off between linearity and efficiency.

It is important that each stage of the amplifier chain have adequate linearity with minimum distortion. Therefore, power amplifiers are typically operated in class-A or class-AB configuration, which also implies low efficiency. Other classes of power amplifiers, such as class B power amplifiers, show high efficiency but are often not suitable for linear applications. Hence, it is common to employ the Kahn Envelope Elimination and Restoration (EER) technique with efficient power amplifiers to achieve linear amplification. The Kahn Envelope Elimination Technique is based on combining a highly efficient but nonlinear RF power amplifier with a highly efficient envelope amplifier to implement a high-efficiency linear RF power amplifier. A detailed description of the EER transmitter is given below.

FIG. 2 shows the architecture of a conventional EER transmitter 30. A modulated RF signal is provided at the input terminal of the EER transmitter 30. The RF signal is separated into two separate forward paths by a splitter 32. In the upper path as illustrated, an envelope detector 34 detects the input signal and generates envelope information, E(t). A sigma-delta/pulse-width modulator 36 then digitises the envelope information, E(t), providing an output to a class-S amplifier 38, which amplifies the digitised envelope. The digital output from the class-S amplifier 38 is then filtered by a low pass filter 42 which converts the digital envelope signal back to analogue. The analogue envelope signal is used as the supply voltage for a power amplifier 44. In the lower path, a limiter 40 detects the phase of the input signal. The limiter 40 produces a constant envelope output signal, which is then amplified by the aforementioned power amplifier which is selected to be a power efficient, but highly non-linear, switching power amplifier. The output power of the switching power amplifier 44 is proportional to the DC supply voltage, i.e. $P_{out} \propto V^2_{DD}$. Since the supply voltage, $V_{DD}$, of the power amplifier 44 is derived from the envelope signal, this restores the original envelope of the input signal at the power amplifier stage.

However, one of the major drawbacks of implementing an EER transmitter is that it can only be implemented for narrowband applications. This is generally due to the limited bandwidth and low frequency operation of the class-S amplifier stage. Another disadvantage of implementing an EER transmitter is that it cannot be implemented for high peak-to-mean ratio (PMR) communication standards such as wireless local area network (WLAN). This is because high PMR signals require the supply voltage of the power amplifier to be modulated over a large dynamic range which introduces non-linearity.

Another known method of achieving linear and efficient amplification is through the use of Class-S amplifier as a main power amplifier. As shown in FIG. 3, the sigma-delta/pulse-width modulator 52 digitises the input RF signal. The digitised output waveform is then used to drive the Class-S amplifier 54. Finally the original RF signal is restored at the output of a band-pass filter (BPF) 56. However, this method suffers a drawback, in that with the current technology it is difficult to digitise an RF signal.

A transmitter architecture was proposed in Yuanxun Wang, "An improved Kahn transmitter architecture based on delta-sigma modulation", IEEE International Microwave Symposium Digest, Volume 2, June 2003, Page 1327 to 1330. The transmitter architecture described is based on combining the EER concept and the digital modulation concept mentioned in the previous paragraph. Referring to FIG. 4, the envelope and carrier of the input RF signal is split into two separate paths. The envelope signal is digitised using a delta-sigma modulator 66 and the digitised envelope is directly modulated on a carrier using an RF mixer 72. The final RF output is obtained by passing the modulated signal through a class-S power amplifier 74 and a band pass filter 76.

A similar transmitter architecture was also proposed in Alexandre Dupuy and Yuanxun Ethan Wang, "High efficiency power transmitter based on Envelope Delta-Sigma Modulation (EDSM)", Vehicular Technology Conference, Volume 3, September 2004, Page 2092 to 2095. In this transmitter circuit, a Class-E power amplifier is employed instead of a Class-S power amplifier.

SUMMARY OF THE INVENTION

Embodiments of the invention include apparatus and methods for signal processing for use with a power amplifier in a wireless circuit.

In a first aspect of the present invention, there is provided a signal processor for use in a wireless transmitter, for generating a radio frequency signal suitable for transmission, either with or without further power amplification, the signal processor comprising signal separating means for separating an input signal into first and second processing paths, the first processing path comprising signal envelope processing means for generating a pulse train signal being a digitised envelope signal, and the second processing path comprising phase processing means operable to generate a constant envelope phase signal, and further comprising an RF switch operable to switch said phase signal by means of said pulse train signal.

In an embodiment of the present invention, said signal separating means comprises an input terminal and at least a first output terminal and a second output terminal, most preferably two output terminals are provided, wherein said first and second output terminals are connected to said first and second processing paths respectively.

Preferably, said envelope processing means comprises an input terminal and an output terminal.

Preferably, said input terminal of said envelope processing means is connected with said first output terminal of said signal separating means.

In another embodiment of the present invention, said signal envelope processing means further comprises an envelope detecting means for generating an envelope signal, and an envelope digitising means for generating said pulse train signal.

Preferably, said envelope detecting means comprises an input terminal and an output terminal, and said input terminal of said envelope detecting means is the input terminal of said envelope processing means.

Preferably, said envelope digitising means comprises an input terminal and an output terminal, and said output terminal of said envelope detecting means is the output terminal of said envelope processing means.

Preferably, said output terminal of said envelope detecting means is connected to said input terminal of said envelope digitising means.

In another embodiment of the present invention, said RF switch comprises an input terminal, an output terminal and a control terminal.

The output terminal of said RF switch may be the output terminal of said signal processor.

Preferably, the output terminal of said envelope processing means is connected to said control terminal of said RF switch In another embodiment of the present invention, said phase processing means comprises an input terminal and an output terminal.

Preferably, said input terminal of said phase processing means is connected to said second output terminal of said signal separating means and said output terminal of said phase processing means is connected to said input terminal of said RF switch.

In one configuration of the above aspect, said envelope processing means, said phase processing means and said RF switch may be employed within a digital signal processor (DSP).

In another embodiment of the present invention, a method of processing an input signal for generating a radio frequency signal suitable for transmission, the method comprising the steps of:

generating a pulse train signal from said input signal, said pulse train signal being a digitised envelope signal;

generating a constant envelope phase signal from said input signal; and

RF switching said constant envelope phase signal by means of said pulse train signal.

Preferably, said step of generating an envelope signal further comprises the step of detecting the envelope of said input signal and digitising said detected input envelope signal.

BRIEF DESCRIPTION OF THE DRAWINGS

Embodiments of the invention will now be described with reference to the accompanying drawings, wherein.

DETAILED DESCRIPTION

A method and apparatus for processing signals prior to amplification is disclosed. In the following description, a number of specific details are presented in order to provide a thorough understanding of embodiments of the present invention. It will be apparent, however, to a person skilled in the art that these specific details need not be employed to practice the present invention.

Figure 1:
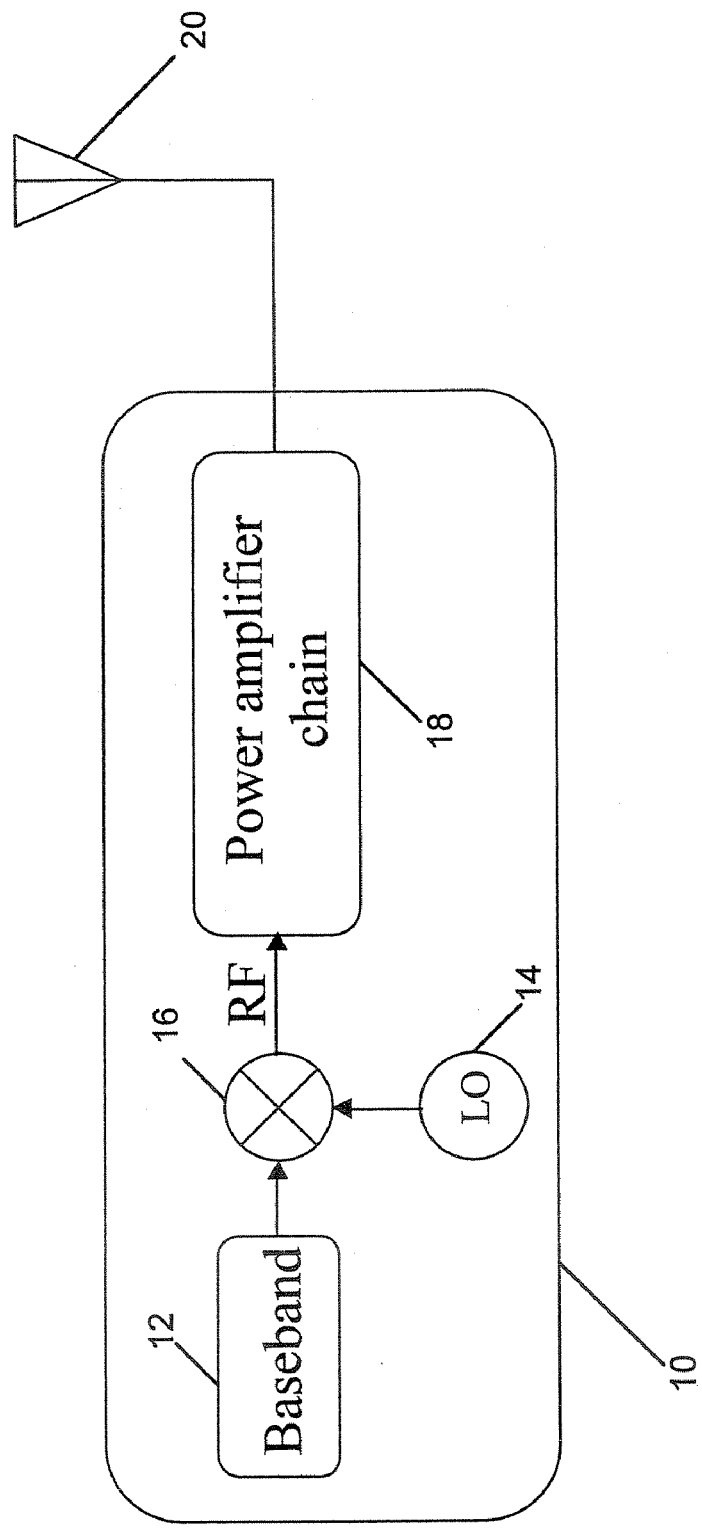
FIG. 1 shows a transmitter in accordance with a conventional architecture.
Figure 2:
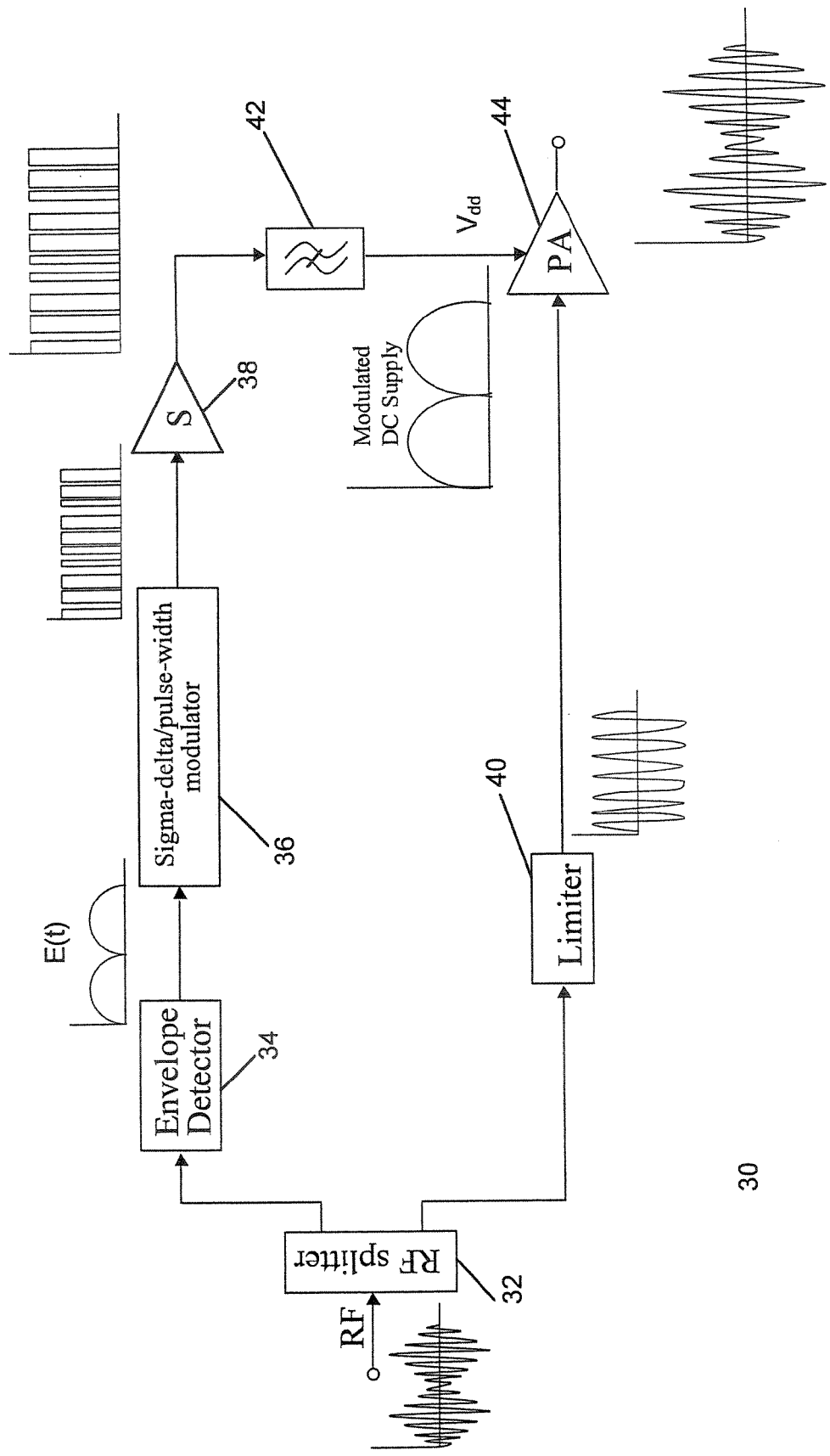
FIG. 2 shows a conventional envelope elimination and restoration (EER) transmitter.
Figure 3:
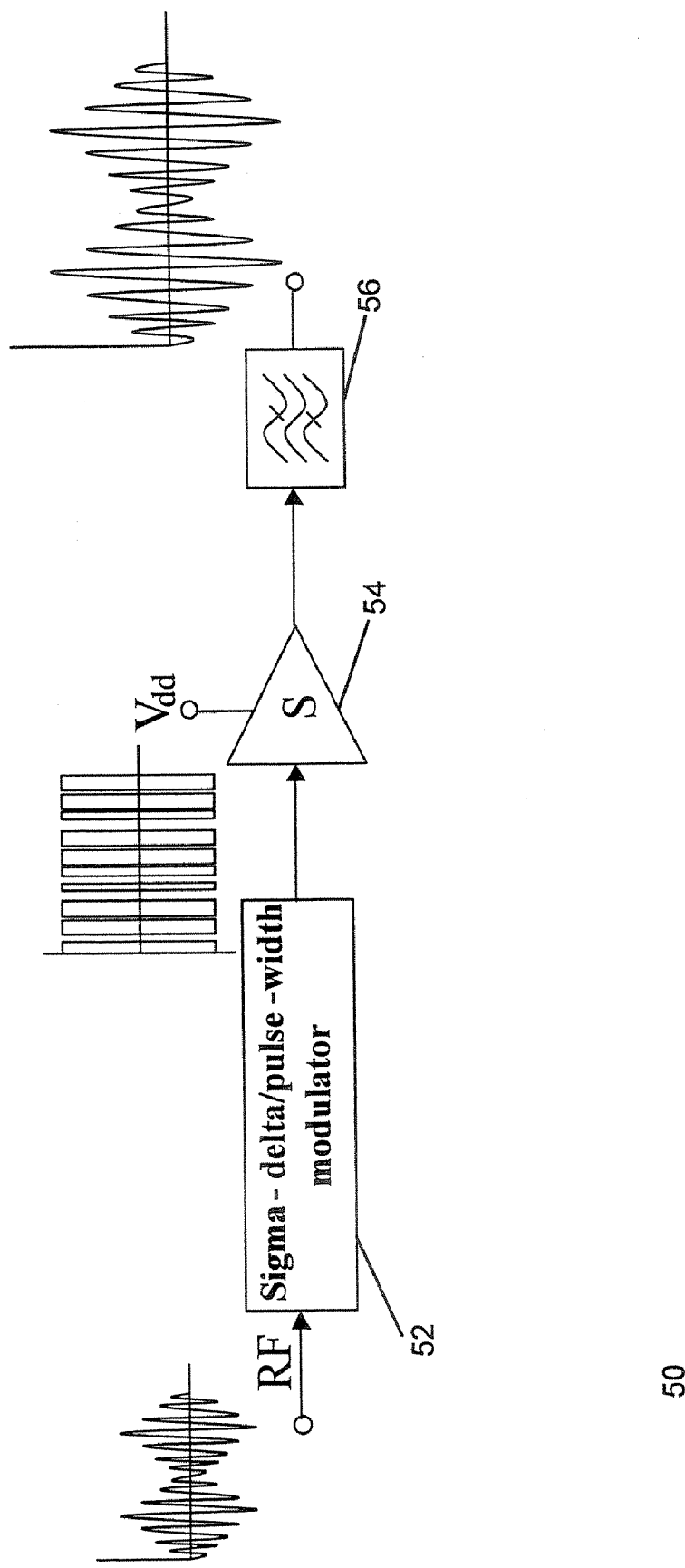
FIG. 3 shows a conventional delta-sigma/pulse-width modulated class-S PA.
Figure 4:
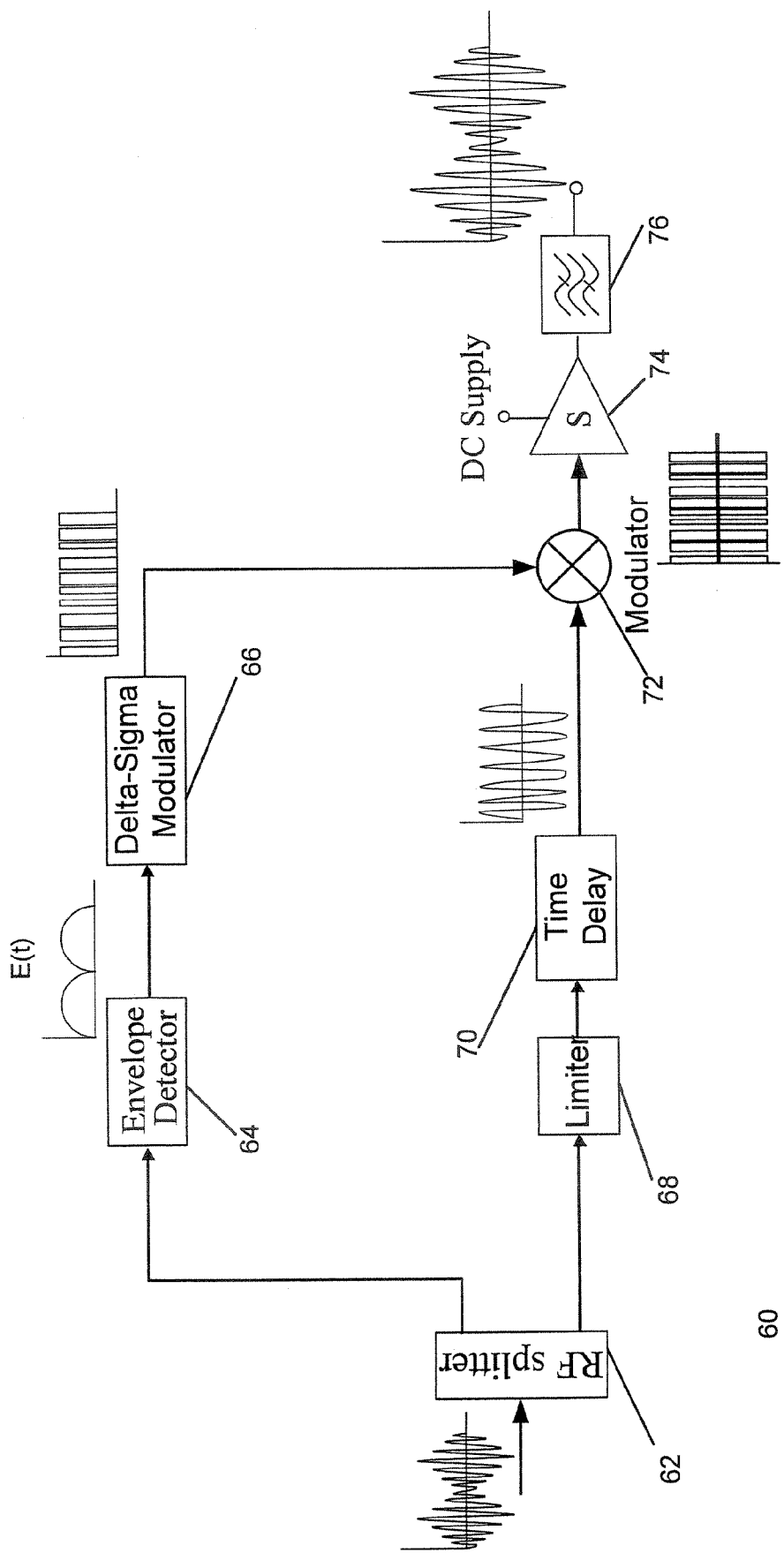
FIG. 4 shows a signal processor according to described prior art.
Figure 5:
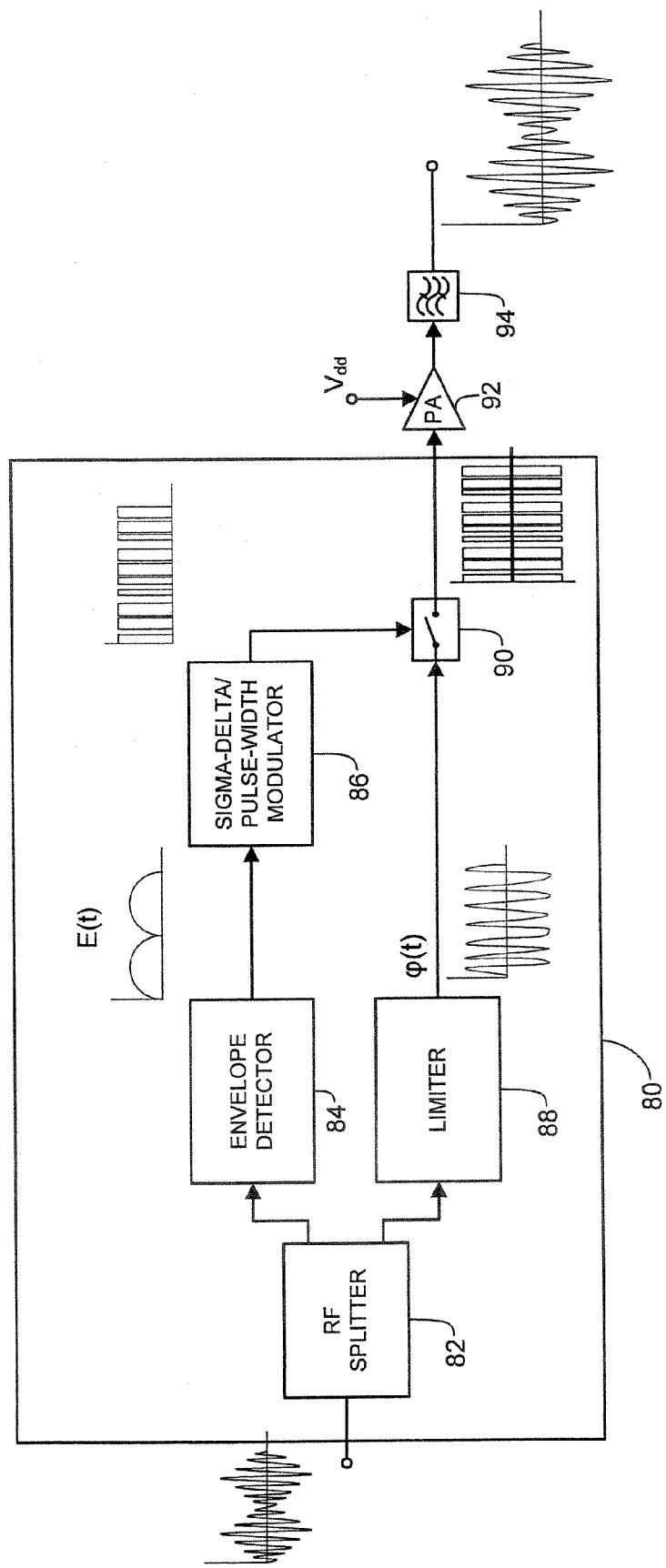
FIG. 5 shows a transmitter including a signal processor according to an embodiment of the present invention.

FIG. 5 shows a circuit diagram of an RF amplifier 100 comprising a signal processor 80 according to an embodiment of the present invention. Referring to FIG. 5, the signal processor 80 comprises a splitter 82, envelope detector 84, sigma-delta/pulse-width modulator 86, limiter 88 and RF switch 90. The output terminals of the splitter 82 are connected to the envelope detector 84 and the limiter 88. The envelope detector 84 is, in turn, connected to the sigma-delta/pulse-width modulator 86. The output terminal of the sigma-delta/pulse-width modulator 86 is connected to the control terminal of the RF switch 90 to control the operation of the RF switch 90. The output of the limiter 88 is connected to the input terminal of the RF switch 90. The output terminal of the device 50 is connected to the power amplifier 62.

The operation of the signal processor 80 in FIG. 5 will now be described. A modulated RF signal is provided at the input terminal of the coupler, which divides the RF signal into two separate paths, named hereafter as 'first' and 'second' paths as illustrated. In the first path, the envelope detector 84 generates the envelope signal, E(t). The envelope signal E(t) is then digitised by the sigma-delta/pulse-width modulator 86, which generates a pulse train signal. The pulse train signal controls the operation of the RF switch 90, i.e. the RF switch 90 turns on/off according to the pulse-train. In the second path, the limiter 88 generates phase signals, φ(t). The limiter 88 generates a constant envelope output signal which is connected to the input terminal of the RF switch 90. The digitised signal in the first path converts the constant RF signal in the second path into a binary signal, which is then amplified by the power amplifier 92.

Finally, the RE output is obtained by passing the amplified signal through the band pass filter 94. It will be appreciated that, in certain circumstances, it may be possible to employ the resonant qualities of the antenna to which the output is to be connected, and to match with the output to the extent that the band pass filter 94 may be dispensed with.

In the present embodiment, the digitised envelope signal is used for controlling the operation of the RF switch 90 rather than supplying the power amplifier 92. Hence, amplification of the envelope signal is not required and the class-S amplifying stage used in conventional EER architectures can be eliminated. The elimination of class-S amplifying stage provides a number of advantages compared to a conventional EER transmitter:

i. The power amplifier is supplied with constant DC-supply which means that maximum power added efficiency (PAE) can be achieved at all times without depending on the envelope level of the transmitted signal;

ii. It also enables the power amplifier to amplify high peak-to-mean ratio (PMR) signals without adding distortion; and;

iii. Elimination of the narrowband class-S amplifier enables the transmitter to operate over a broad bandwidth.

Figure 6:
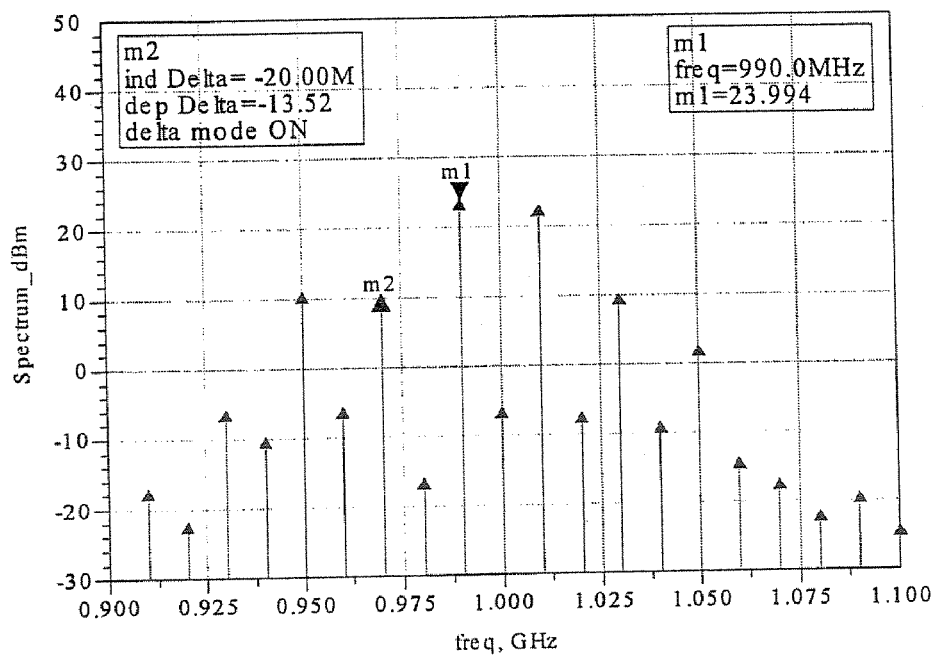
FIG. 6 shows the simulated output spectrum of the conventional EER transmitter.
Figure 7:
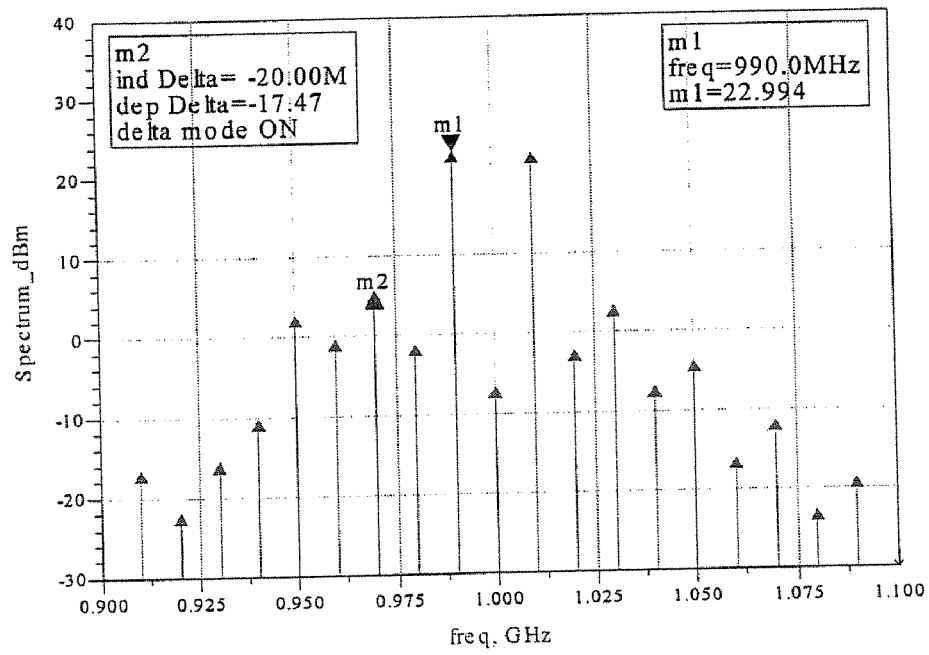
FIG. 7 shows the simulated output spectrum of a signal processor employed with a power amplifier according to an embodiment of the invention.

FIGS. 6 and 7 show the simulated output spectrum of the conventional EER transmitter and signal processor of the present invention respectively. As shown in these figures, there is an improvement in the third order intermodulation level of 3.95 dB when the signal processor of the present invention is employed compared to the conventional EER transmitter.

Figure 8:
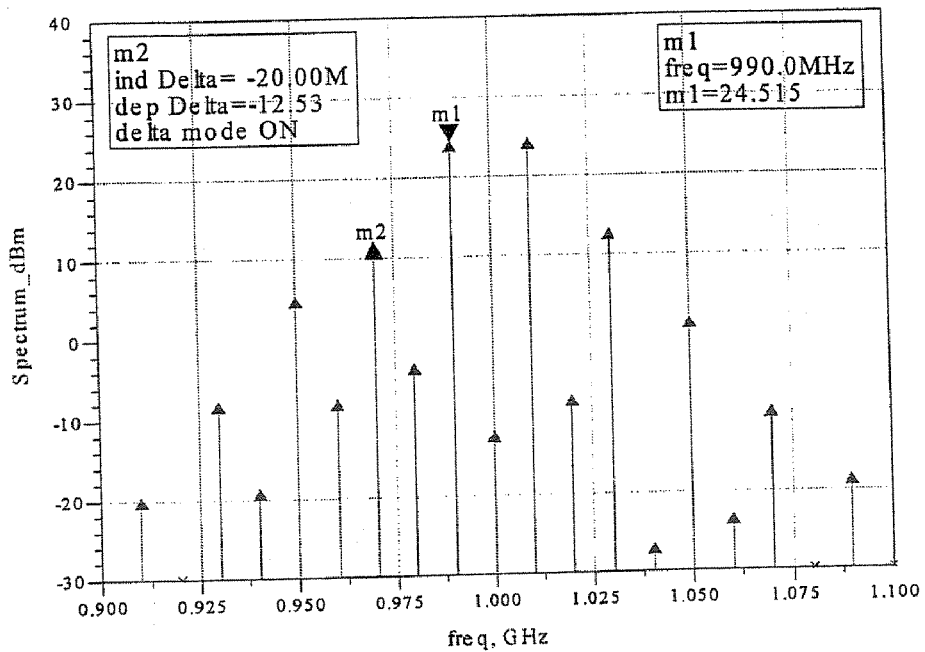
FIG. 8 shows the simulated output spectrum of the prior art using an RF mixer as a modulator.
Figure 9:
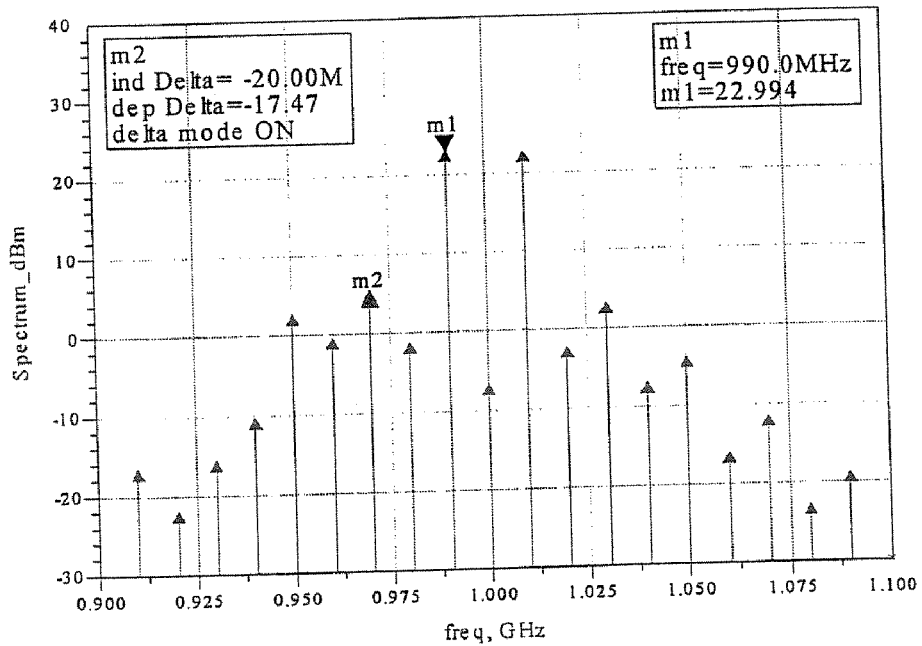
FIG. 9 shows the simulated output spectrum of the signal processor in accordance with the described specific embodiment employed with a power amplifier using single-pole single-throw (SPST) switch as the modulator.

FIGS. 8 and 9 show the simulated output spectrum of the transmitter in the prior art using an RF mixer as a modulator and the signal processor of the present invention using an RF switch respectively. From the figures, the third order intermodulation level improves by 4.94 dB when an RF switch is used as the modulator.

In FIG. 5, the RF switch is shown as a Single-Pole Single Throw (SPST) switch. As shown in FIGS. 8 and 9, the signal processor that implements an SPST switch displays a much better performance than the transmitter that uses a RF mixer in the prior art. One of the disadvantages of using a RF mixer as a modulator is that it reduces the PAE, increases the distortion and requires the envelope information to be amplified due to the high signal level required to drive the RF mixer. In contrast, the SPST offers advantages such as:

i. An SPST switch can operate with lower supply level compared with an RF mixer, which enables elimination of amplification and hence the class-S amplifying stage;

ii. Elimination of the S-class stage increases the bandwidth of the transmitter, as compared with conventional arrangements;

iii. An SPST switch, as opposed to an RF mixer, provides higher isolation, lower insertion loss and higher linearity. This improves the linearity and power efficiency of the transmitter, as will be appreciated from the foregoing discussion.

Presently, commercially available SPST switches include devices fabricated in Gallium Arsenide. Examples of such switches include the following, with the characteristics set out in table 1 below:

TABLE 1

| Manufacturer | Device | Contact Function | Frequency (GHz) | Insertion Loss (dB) | P1dB (in) (dBm) | Switching speed (nsec) | Isolation (dB) | Control Logic |
|---|---|---|---|---|---|---|---|---|
| MA-Com | MASW6010G | SPDT | 0-6 | 0.5 | 33 | 2 | 38 | −8-0 |
| Hittite | HMC231G7 | SPST | 0-6 | 1.4 | 27 | 3 | 52 | −5-0 |
| Hittite | HMC233G8 | SPDT | 0-6 | 1.4 | 26 | 3 | 43 | −5-0 |
| Hittite | HMC232G7 | SPDT | 0-6 | 1.4 | 27 | 3 | 50 | −5-0 |
| Hittite | HMC336MS8G | SPDT | 0-6 | 1.6 | 25 | 8 | 42 | 0-5 |
| Hittite | HMC224MS8 | SPDT | 5-6 | 1.2 | 31 | 10 | 33 | TTL-CMOS |

Naturally, it will be appreciated that an SPDT device can be used as an SPST device. Further, from the data set out above, it will be seen that the most high performance device identified in the table (from the perspective of switching speed) is the MASW6010G device offered by M/A-Com, of Tyco International of Lowell, Mass., U.S.A.

This device offers a switching speed of 2 ns (rise-time), therefore the total rise and fall time is 4 ns. This corresponds to a maximum deliverable frequency of 250 MHz which, taking into account an oversampling ratio of 10, provides the opportunity for a 25 MHz bandwidth. By using such a switch, the need for a class-S amplifier to drive such high frequencies is eliminated.

It will be appreciated that, with advances in technology, ever faster solid state switches will become available. Moreover, other technologies may be introduced, allowing further improvements in switching speed, thereby allowing further increases in bandwidth. The present disclosure is not limited to use of solid state switches of this type, and nor is any artificial limitation on bandwidth imposed by the description of this specific embodiment.

Also, whereas a discrete component is described, the use of a switching component on the same integrated circuit as preceding or following components is not excluded.

Figure 10:
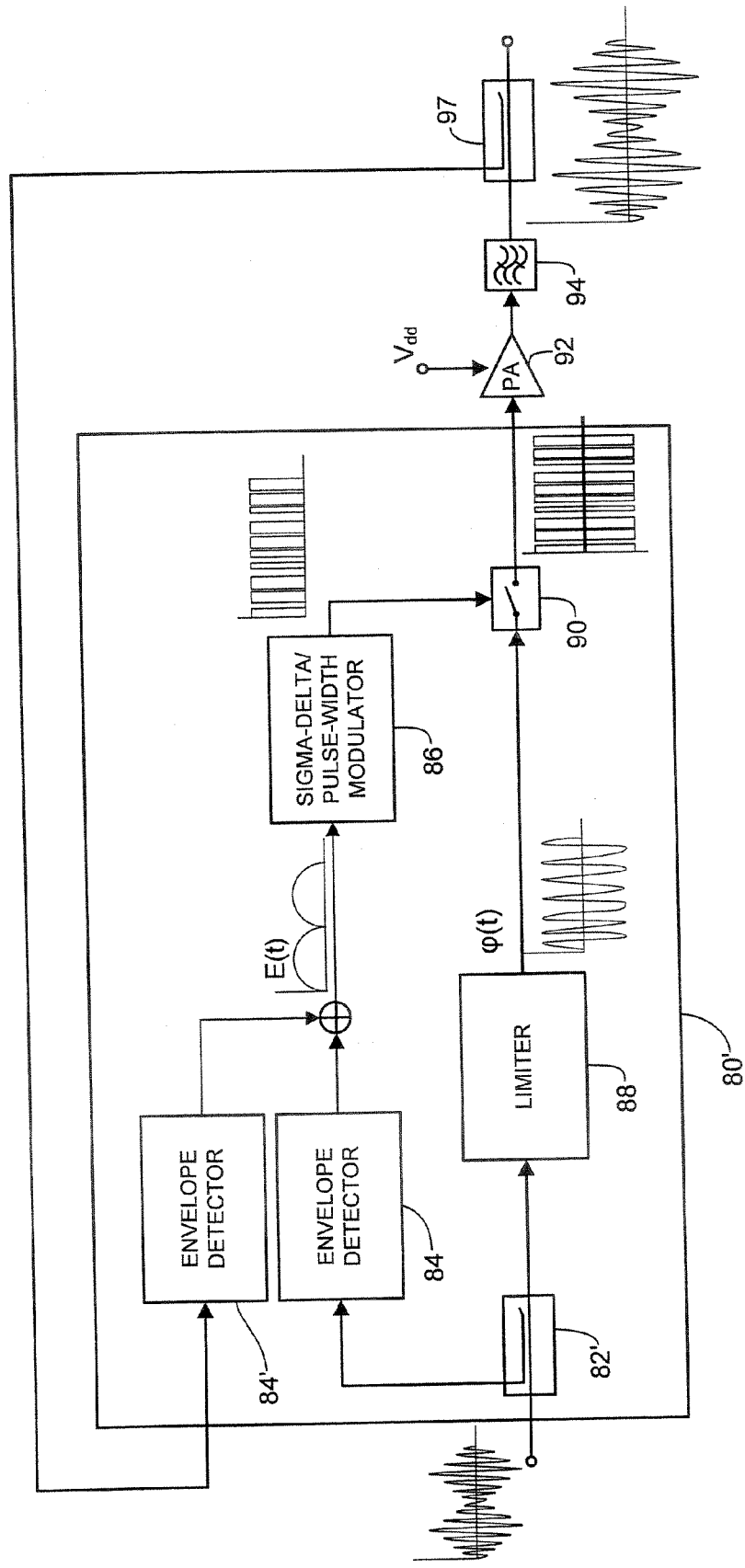
FIG. 10 illustrates a circuit diagram of an amplifier in accordance with a second embodiment of the invention.
Figure 11:
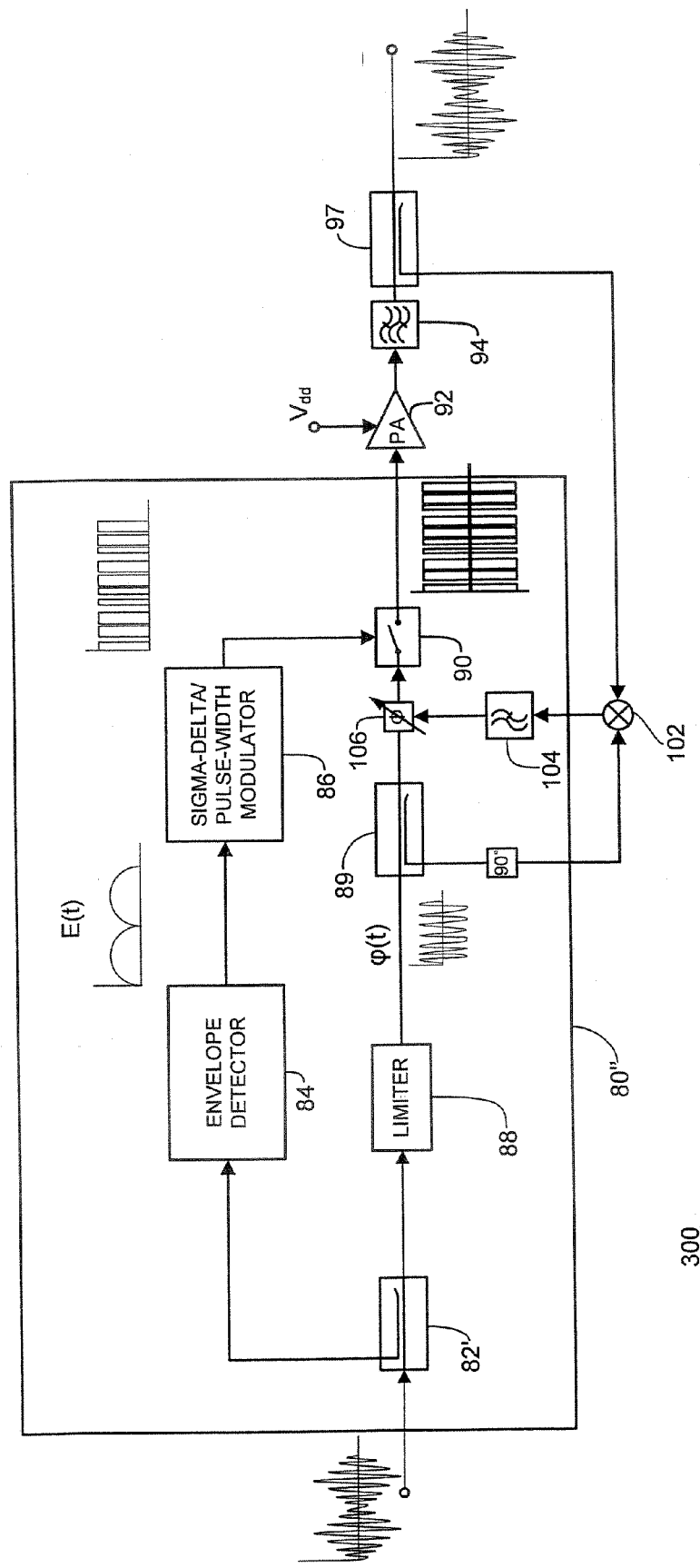
FIG. 11 illustrates a circuit diagram of an amplifier in accordance with a third embodiment of the invention.
Figure 12:
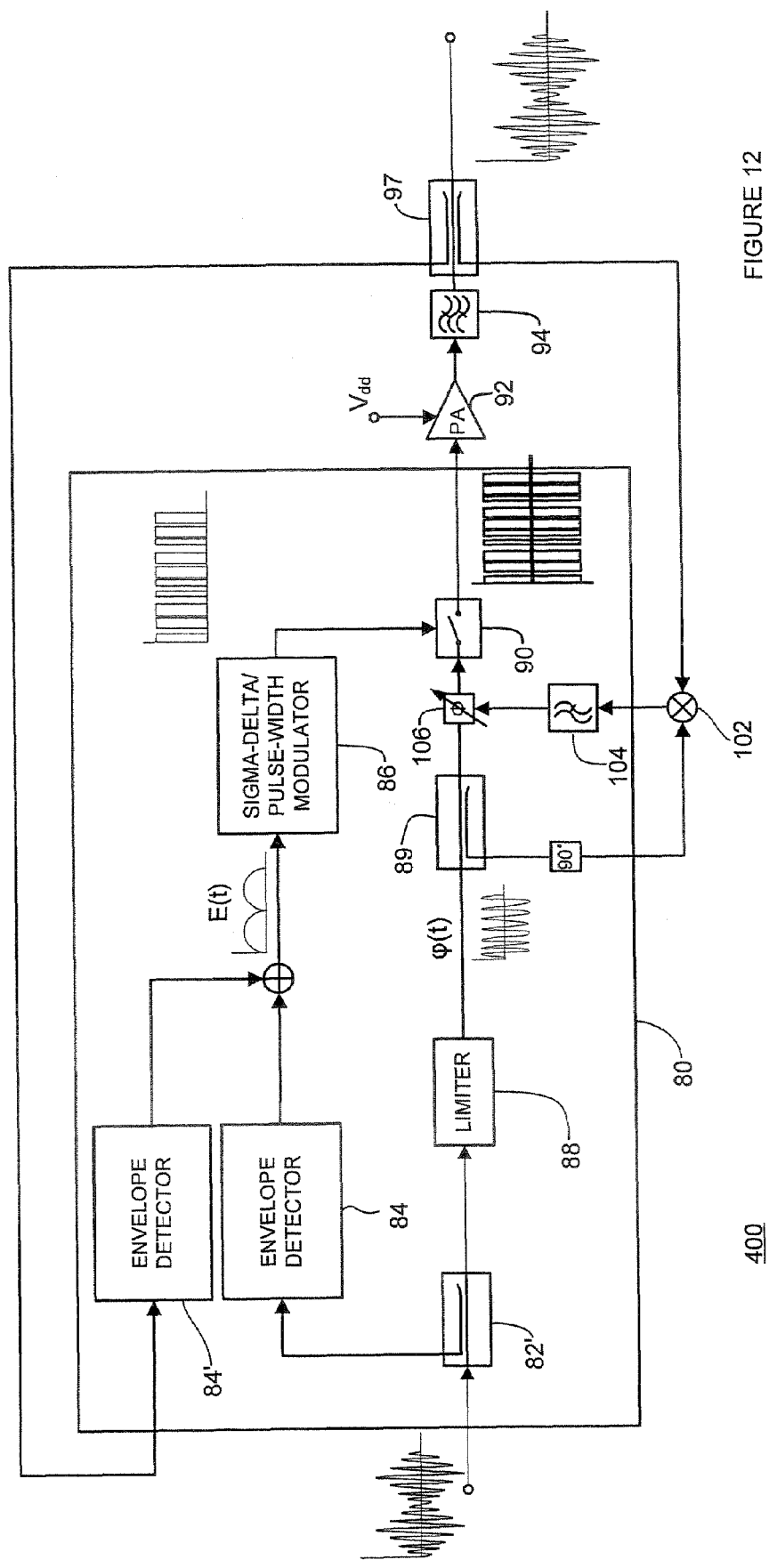
FIG. 12 illustrates a circuit diagram of an amplifier in accordance with a fourth embodiment of the invention.

FIGS. 10, 11 and 12 illustrate further RF amplifiers in accordance with specific embodiments of the invention. Where appropriate, those elements of the additional embodiments which are common with the foregoing description of the signal processor 80 illustrated in FIG. 5 are accorded the same reference numeral.

Firstly, FIG. 10 illustrates a modification of the transmitter amplifier 100 illustrated in FIG. 5. A transmitter amplifier 200 provides a switched amplifier 80' which is essentially a modified version of the amplifier 80 illustrated in FIG. 5. While the amplifier 80' provides an RF splitter 82' (herein illustrated as a coupler), feeding a first feed to an envelope detector 84, and a second feed to a limiter 88 as previously described.

In this embodiment, the output of the envelope detector 84 is summed with the output of a further envelope detector 84', the input of which comprises a feed from a coupler 97 applied to the output of the band pass filter 94. This sum constitutes E(t). This modification makes use of the technology disclosed in "L-band transmitter using Kahn EER technique" (F. H. Raab, E. B. Sigrnon, G. R. Myers and M. R. Jackson, IEEE Transactions on Microwave Theory and Techniques, December 1998, Vol: 46, no: 12 pt 2, pp. 2220-2225).

FIG. 11 provides a further embodiment 300 of the invention, in which phase correcting feedback is provided. This makes use of technology disclosed in "Phase-correcting feedback system for class E power amplifier" (T. Sowlati, Y. M. Greshishchev, C. A. T. Salama, IEEE Journal of Solid-State Circuits, Volume: 32, Issue: 4, April 1997, pp. 544-549).

In FIG. 11, again, a modified signal processor 80" is provided, which interposes a coupler 89 between the limiter 88 and the RF switch 90. The output of this coupler 89 is shifted by a 90° phase shift. This is then combined with an output feedback signal from the coupler 97, by means of a multiplier 102, which acts as a phase detector. The resultant phase detection signal is passed through a low pass filter 104, the output of which controls a phase shift unit 106 which controls phase shift of signal output from the coupler 89, through to the RF switch 90. This provides further robustness of the phase of the output signal.

As will be readily appreciated from the foregoing, FIG. 12 illustrates a further modification 400 of the transmitter amplifier 100 illustrated in FIG. 5, incorporating in combination the features of the modifications illustrated in FIGS. 10 and 11. In this case, advantage is taken of the combined benefit of envelope feedback and phase feedback demonstrated in the previous examples.

A specific embodiment and several modifications have been described above. However, it is not intended that the invention be limited to these embodiments. Various modifications will be apparent to those skilled in the art. The features of the above described arrangements may be combined in various ways to provide similar advantages in alternative arrangements.

It will be understood that the signal processing device, and the wireless transmitter operable to use them as described above provide at least one or more of the following advantages:
i. Delivers maximum PAE at all times regardless of the transmitted signal level;
ii. Extends battery life;
iii. Eliminates supply voltage modulation of the power amplifier required in conventional EER transmitter, therefore waveforms with high PMR can be amplified without generating distortion;
iv. Eliminates the narrowband class-S envelope amplifier used in conventional EER transmitters, therefore broadband waveforms can be transmitted;
v. Reduces the circuit complexity and cost; and;
vi. Eliminates the requirement of high sampling rate ADCs, since the RF drive signal is converted to binary by the RF switch.

The invention claimed is:

1. A signal processor for use in a wireless transmitter, for generating a radio frequency signal suitable for transmission, either with or without further power amplification, the signal processor comprising signal separating means for separating an input signal into first and second processing paths, the first processing path comprising signal envelope processing means for generating a pulse train signal being a digitized envelope signal, and the second processing path comprising phase processing means operable to generate a constant envelope phase signal, and further comprising an RF switch operable to switch said phase signal by means of said pulse train signal, and further comprising a digital signal processor implementing said envelope processing means, said phase processing means and said RF switch.

2. A signal processor in accordance with claim 1, wherein said signal separating means comprises an input terminal and at least a first output terminal and a second output terminal.

3. A signal processor in accordance with claim 2, wherein said first and second output terminals are connected to said first and second processing paths respectively.

4. A signal processor in accordance with claim 1, wherein said envelope processing means comprises an input terminal and an output terminal.

5. A signal processor in accordance with claim 4, wherein said input terminal of said envelope processing means is connected with said first output terminal of said signal separating means.

6. A signal processor in accordance with claim 1, wherein said signal envelope processing means further comprises an envelope detecting means for generating an envelope signal, and an envelope digitizing means for generating said pulse train signal.

7. A signal processor in accordance with claim 6, wherein said envelope detecting means comprises an input terminal and an output terminal, and said input terminal of said envelope detecting means is the input terminal of said envelope processing means.

8. A signal processor in accordance with claim 7, wherein said envelope digitizing means comprises an input terminal and an output terminal, and said output terminal of said envelope detecting means is the output terminal of said envelope processing means.

9. A signal processor in accordance with claim 8, wherein the output terminal of said envelope detecting means is connected to the input terminal of said envelope digitizing means.

10. A signal processor in accordance with claim 1, wherein said RF switch comprises an input terminal, an output terminal and a control terminal.

11. A signal processor in accordance with claim 10, wherein said output terminal of said RF switch is the output terminal of said signal processor.

12. A signal processor in accordance with claim 10, wherein an output terminal of said envelope processing means is connected to said control terminal of said RF switch.

13. A signal processor in accordance with claim 1, wherein said phase processing means comprises an input terminal and an output terminal.

14. A signal processor in accordance with claim 13 wherein said input terminal of said phase processing means is connected to a second output terminal of said signal separating means and said output terminal of said phase processing means is connected to an input terminal of said RF switch.

15. A method of processing an input signal for generating a radio frequency signal suitable for transmission, the method comprising the steps of
generating a pulse train signal from said input signal, said pulse train signal being a digitized envelope signal;
generating a constant envelope phase signal from said input signal; and
RF switching said constant envelope phase signal by means of said pulse train signal,
wherein a digital signal processor implements the steps of generating a constant envelope phase signal from said input signal and RF switching said constant envelope phase signal by means of said pulse train signal.

16. A method in accordance with claim 15, wherein said step of generating an envelope signal further comprises the step of detecting the envelope of said input signal and digitizing said detected input envelope signal.

* * * * *